(12) United States Patent
Ohyanagi et al.

(10) Patent No.: US 7,307,313 B2
(45) Date of Patent: Dec. 11, 2007

(54) SEMICONDUCTOR DEVICE INCLUDING A VERTICAL FIELD EFFECT TRANSISTOR, HAVING TRENCHES, AND A DIODE

(75) Inventors: Takasumi Ohyanagi, Hitachinaka (JP); Atsuo Watanabe, Hitachiota (JP); Toshio Sakakibara, Nishio (JP); Tsuyoshi Yamamoto, Kariya (JP); Hiroki Nakamura, Handa (JP); Rajesh Kumar Malhan, Nagoya (JP)

(73) Assignees: Hitachi, Ltd., Tokyo (JP); Denso Corporation, Kariya-Shi (JP)

( * ) Notice: Subject to any disclaimer, the term of this patent is extended or adjusted under 35 U.S.C. 154(b) by 151 days.

(21) Appl. No.: 11/206,212

(22) Filed: Aug. 18, 2005

(65) Prior Publication Data
US 2006/0076613 A1 Apr. 13, 2006

(30) Foreign Application Priority Data
Sep. 24, 2004 (JP) ............................. 2004-276565

(51) Int. Cl.
*H01L 29/76* (2006.01)
(52) U.S. Cl. .................. 257/330; 257/77; 257/328; 257/329; 257/577
(58) Field of Classification Search ........ 257/328–330, 257/77, 577, E29.118
See application file for complete search history.

(56) References Cited

U.S. PATENT DOCUMENTS

| | | | | |
|---|---|---|---|---|
| 4,942,445 A | * | 7/1990 | Baliga et al. | 257/141 |
| 6,211,549 B1 | * | 4/2001 | Funaki et al. | 257/329 |
| 6,265,744 B1 | * | 7/2001 | Okumura | 257/330 |
| 6,323,518 B1 | * | 11/2001 | Sakamoto et al. | 257/330 |
| 6,781,199 B2 | * | 8/2004 | Takahashi | 257/330 |
| 7,154,145 B2 | * | 12/2006 | Takahashi | 257/328 |
| 2003/0042538 A1 | | 3/2003 | Kumar et al. | |
| 2003/0178672 A1 | | 9/2003 | Hatakeyama et al. | |

FOREIGN PATENT DOCUMENTS

| JP | 9-508492 | 8/1997 |
|---|---|---|
| WO | WO 95/18465 | 7/1995 |

OTHER PUBLICATIONS

U.S. Appl. No. 11/138,298, filed May 27, 2005.

(Continued)

*Primary Examiner*—Eugene Lee
(74) *Attorney, Agent, or Firm*—Antonelli, Terry, Stout & Kraus, LLP.

(57) ABSTRACT

A semiconductor device includes (a) a vertical field effect transistor, the vertical field effect transistor including a drain electrode formed on a first surface of a first conductivity type of a semiconductor, a pair of first trenches formed from a second surface of the semiconductor, control regions of a second conductivity type formed respectively along the first trenches, a source region of the first conductivity type formed along the second surface of the semiconductor between the first trenches, a source electrode joined to the source region, and a gate electrode adjacent to the control regions, (b) a pair of second trenches formed from the second surface of the semiconductor independently of the field effect transistor, (c) control regions of the second conductivity type formed along the second trenches, and (d) a diode having a junction formed on the second surface between the second trenches.

7 Claims, 10 Drawing Sheets

OTHER PUBLICATIONS

"Power Device, Power IC Handbook", 1st edition, published by Corona Publishing Co., Ltd., Jul. 30, 1996.

A.B. Horsfall et al., "Optimisation of a 4H-SiC Enhancement Mode Power JFET", Materials Science Forum Vols. 433-436 (2003) pp. 777-780.

Kiyoshi Tone et al., "4H-SiC Normally-Off Vertical Junction Field-Effect Transistor With High Current Density", IEEE Electron Device Letters, vol. 24, No. 7, Jul. 2003.

* cited by examiner

SEMICONDUCTOR DEVICE INCLUDING A VERTICAL FIELD EFFECT TRANSISTOR, HAVING TRENCHES, AND A DIODE

CROSS-REFERENCE TO RELATED APPLICATION

The present application relates to subject matters described in a co-pending patent application Ser. No. 11/138,298 filed on May 27, 2005 entitled "SEMICONDUCTOR DEVICES" and assigned to the assignees of the present application. The disclosures of this co-pending application are incorporated herein by reference.

BACKGROUND OF THE INVENTION

The present invention relates to a semiconductor device. In particular, the present invention relates to a semiconductor device using silicon carbide.

Because of their excellent properties, field effect transistors using silicon carbide are anticipated to be used in a high temperature environment at a temperature of, for example, at least 150° C., preferably at a temperature of at least 300° C. which cannot be achieved with field effect transistors using silicon.

However, field effect transistors using silicon carbide cannot be applied to any high temperature environment. Since there is an upper limit in their operation temperature, a temperature sensor must be mounted. In field effect transistors using silicon, the temperature is sensed by using a diode formed of polycrystalline silicon on the same substrate as a transistor via an insulation film as disclosed in, for example, "Power Device, Power IC Handbook," first printing in first edition, published by CORONA PUBLISHING CO., LTD. on Jul. 30, 1996, (FIG. 7.53).

However, the diode formed of polycrystalline silicon does not operate in a high temperature environment anticipated in the case of silicon carbide, and it cannot be used as the temperature sensor. Therefore, it is necessary to sense the high temperature by using a diode using silicon carbide or a hetero junction diode formed of silicon carbide and polycrystalline silicon.

If a diode such as a p-n junction diode, a hetero junction diode or a Schottky diode can be formed on the same substance as a field effect transistor together with the field effect transistor for the purpose of not only sensing at high temperatures but also overcurrent sensing or overvoltage sensing, a great benefit can be obtained from the viewpoint of cost as well.

As for field effect transistors, there are normally-off type JFETs (Junction Field Effect Transistors) having a trench as disclosed in JP-A-9-508492 (FIGS. 6 to 11), Materials Science Forum, Vol. 433-436 (2003), pp. 777-780, and IEEE Electron Device Letters, Vol. 24, NO. 7, pp. 463-465. In these JFETs, normally-off type is implemented by determining the concentration and width of control layers so as to bring the control layers (control regions) that are formed along trenches and that are different in conductivity type from a substrate into a pinched-off state when a voltage is not applied.

SUMMARY OF THE INVENTION

It is an object of the present invention to provide a semiconductor device having a field effect transistor using silicon carbide and a certainly insulated diode formed on the same substrate.

In a desirable implementation aspect of the present invention, a normally-off vertical silicon carbide JFET (Junction Field Effect Transistor) having trenches as mentioned in JP-A-9-508492 (FIGS. 6 to 11), Materials Science Forum, Vols. 433-436 (2003), pp. 777-780, and IEEE Electron Device Letter, Vol. 24, NO. 7, pp. 463-465 is used as a field effect transistor. In these JFETs, control regions (control layers) of a second conductivity type p (or n) respectively formed along the trenches are in a pinch-off state when a voltage is not applied. Separation between elements is conducted by utilizing this. In other words, a structure in which a diode is built in over trenches corresponding to a source portion of the JFET is used.

In a desirable implementation aspect of the present invention, a layer of the first conductivity type n (or p) in a source portion is used for the cathode. An anode layer of a second conductivity type p (or n) is formed inside the cathode layer by using ion implantation. A hetero junction diode is formed by depositing a polysilicon layer of the second conductivity type p (or n) on the layer of the first conductivity type n (or p) in the source portion and conducting patterning.

In another desirable implementation aspect of the present invention, a fourth layer of the first conductivity type n (or p) is formed inside a deep third layer of the second conductivity type p (or n) in a normally-off vertical silicon carbide JFET having trenches formed from a second surface of a semiconductor substrate of the first conductivity type n (or p). A diode is built in between the fourth layer and the second surface.

In another preferable implementation aspect of the present invention, a fifth layer of the second conductivity type is formed along the second surface of the semiconductor substrate between the field effect transistor and the diode. An electrode is joined to the fifth layer, and grounded. As a result, separation is conducted so as to prevent a high voltage applied to a first surface of the semiconductor substrate from being applied to the built-in diode, and the separation portion is grounded.

In a desirable implementation aspect of the present invention, typically pinch-off is caused by control layers respectively disposed along the trenches. Therefore, a voltage applied to a first surface of the semiconductor substrate does not affect the diode. As a result, a diode capable of operating up to a high temperature can be obtained on the same substrate as the field effect transistor.

In another desirable implementation aspect of the present invention, a voltage applied to a first surface of the substrate is prevented by the deep third layer of the second conductivity type p (or n) from affecting the diode disposed inside the third layer. As a result, a diode capable of operating up to a high temperature can be obtained on the same substrate as the field effect transistor.

Other objects and features of the present invention will be clarified by the ensuing description of embodiments.

DESCRIPTION OF THE INVENTION

Figure 1:
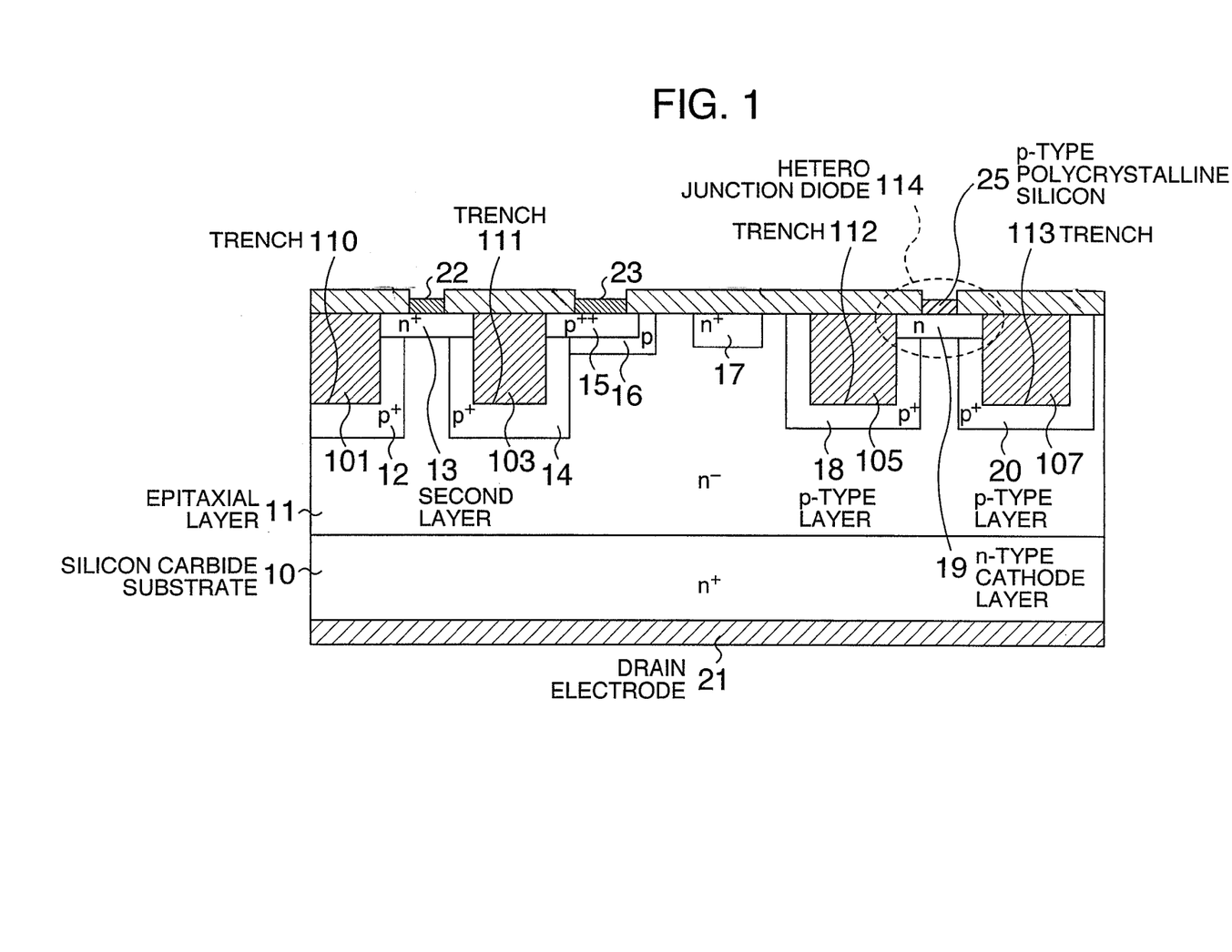
FIG. 1 is a longitudinal section view of a semiconductor device according to a first embodiment of the present invention.

FIG. 1 is a longitudinal section view of a semiconductor device according to a first embodiment of the present invention. A silicon carbide semiconductor substrate having a band gap of at least 2.0 eV includes a semiconductor substrate 10 of a first conductivity type n (or p), and an epitaxial layer 11 of the same first conductivity type n (or p) adjacent to the first layer 10, successively from a first surface side thereof (bottom of FIG. 1). Hereafter, the first conductivity type n (or p) is simply referred to as n-type and the second conductivity type p (or n) is simply referred to as p-type.

Deep trenches 110 and 111 are formed from a second surface side (top side in FIG. 1). These trenches are filled with insulation films 101 and 103, respectively. There are p-type control regions 12 and 14 along side walls of the trenches 110 and 111, respectively. There is a source region 13 along the second surface of a region sandwiched between the two adjacent trenches 110 and 111. A static induction transistor including a drain electrode 21, a source electrode 22 and a gate electrode 23 is thus constituted. A p-type layer 16 is a p-type control layer field limiting portion, and an n-type layer 17 is a punch-through stopper layer.

Trenches 112 and 113 independent of the trenches 110 and 111 are formed on the same substance as the static induction transistor. The trenches 112 and 113 are filled respectively with insulation films 105 and 107 in the same way. There are p-type control layers 18 and 20 along the trenches 112 and 113, respectively. There is an n-type layer 19 in a region sandwiched between the trenches 112 and 113. There is p-type polycrystalline silicon 25 in contact with the n-type cathode layer 19. The p-type polycrystalline silicon 25 is an anode of a hetero junction diode 114. In the depth direction shown in FIG. 1, the p-type polycrystalline silicon 25 does not exist in as far as the deepest portion. In the deepest portion, a cathode electrode of the diode 114 is formed in ohmic contact with the n-type cathode layer 19 (see FIG. 5 described later).

The following is the summary of this embodiment. The subject semiconductor device includes the vertical field effect transistor. The vertical field effect transistor includes the semiconductor substrate 10 of the first conductivity type n (or p) having a band gap of at least 2.0 eV and a low impurity concentration, an epitaxial layer 11 of the first conductivity type n (or p), the drain electrode 21 formed on a first surface of the semiconductor substrate 10, the trenches 110 and 111 formed on the epitaxial layer 11, the source region 13 of the first conductivity type formed between the trenches on the second surface of the semiconductor, the source electrode 22 joined to the source region 13, the gate regions 14 and 15 of the second conductivity type p (or n) formed on the epitaxial layer 11, and the gate electrode 23 adjacent to the gate regions 14 and 15. The semiconductor device includes the pair of trenches 112 and 113 formed on the epitaxial layer 11, the control regions 18 and 20 of the second conductivity type formed respectively along the trenches 112 and 113, and the hetero junction diode 114 sandwiched between the trenches 112 and 113 and having the junction formed on the epitaxial layer 11.

Furthermore, the hetero junction diode 114 includes the cathode region (cathode layer) 19 of the first conductivity type formed between the trenches as shown in FIG. 1, and the polycrystalline silicon 25 of the second conductivity type in contact with the cathode region. In addition, the semiconductor device includes the punch-through stopper layer 17 of the first conductivity type formed in the epitaxial layer 11 between the vertical effect transistor and the diode.

In this way, the hetero junction diode 114 is formed. The distance and concentration between the p-type control layers 18 and 20 are set so as to cause pinch-off when a voltage is not applied to the p-type control layers. A voltage in the range of several hundreds to several thousands volts is applied to the drain electrode 21 of the static induction transistor. Since the p-type control layers 18 and 20 are pinched off, however, the hetero junction diode 114 functions without being affected by the drain voltage. As a result, the hetero junction diode 114 can be applied to temperature sensing, overcurrent sensing, or overvoltage sensing.

Figure 2:
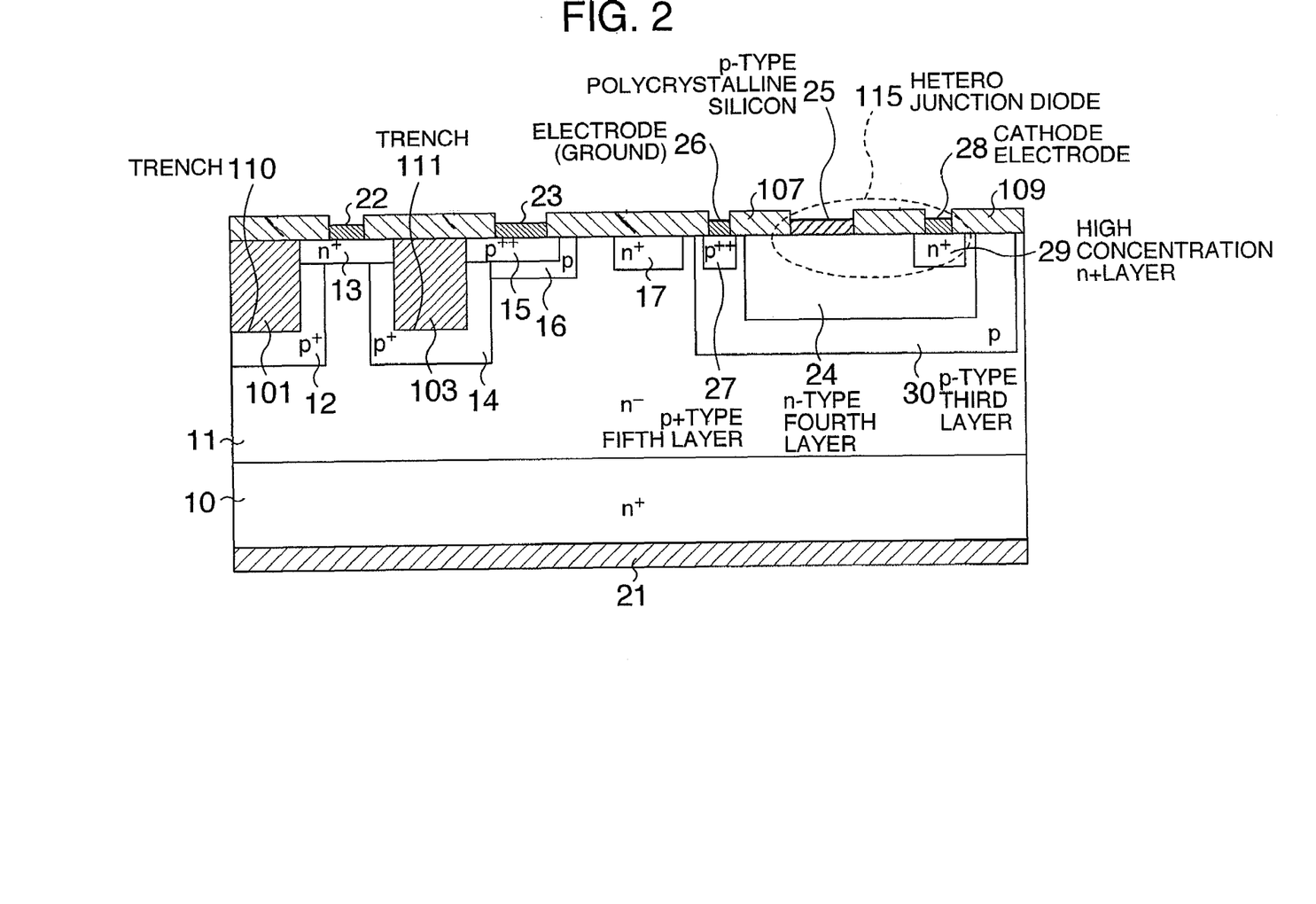
FIG. 2 is a longitudinal section view of a semiconductor device according to a second embodiment of the present invention.

FIG. 2 is a longitudinal section view of a semiconductor device according to a second embodiment of the present invention. There are trenches 110 and 111 on silicon carbide having an n-type semiconductor substrate 10 and an n-type epitaxial layer 11. The trenches 110 and 111 are filled with insulation films 101 and 103, respectively. There are p-type control regions 12 and 14 respectively along side walls of the trenches 110 and 111. There is a source region 13 along the second surface of a region sandwiched between the two adjacent trenches 110 and 111. A static induction transistor including a drain electrode 21, a source electrode 22 and a gate electrode 23 is thus constituted. A p-type layer 16 is a p-type control layer field limiting portion, and an n-type layer 17 is a punch-through stopper layer. The configuration heretofore described is the same as that in FIG. 1. Hereafter, the same portions as those in FIG. 1 are denoted by like reference numerals, and duplicated description will be avoided. Only different configurations will be described.

On the right side of FIG. 2, a deep p-type third layer 30 is provided on the same substrate as the static induction transistor has. An n-type fourth layer 24 is formed inside the third layer 30. A p-type polycrystalline polysilicon 25 is formed in a nearly central surface portion of the fourth layer 24. The p-type polycrystalline polysilicon 25 forms an anode of a hetero junction diode 115. Inside the n-type fourth layer 24, an $n^+$ type high concentration cathode layer 29 is formed along another surface portion of the second surface of the semiconductor substrate. A cathode electrode 28 in ohmic contact with the $n^+$ type high concentration cathode layer 29 is provided to serve as a cathode electrode of the hetero junction diode 115.

Inside the deep p-type third layer 30, a $p^+$ type fifth layer 27 is provided along the second surface. An electrode 26 in ohmic contact with the $p^+$ type fifth layer 27 is provided and grounded. Owing to the grounded electrode 26, it is possible to separate the left portion and the right portion shown in FIG. 2 from each other, i.e., the static induction transistor illustrated on the left side and the diode illustrated on the right side from each other.

The following is the summary of this embodiment. The subject semiconductor device is the same as that of the first embodiment. Independently of the field effect transistor, the semiconductor device includes the third layer 30 of the second conductivity type formed more deeply than the trenches along the second surface of the semiconductor, the fourth layer 24 of the first conductivity type along the second surface inside the third layer, and the diode formed between the fourth layer 24 and the second surface.

This diode is the hetero junction diode 115 including the polycrystalline silicon 25 of the second conductivity type in contact with the surface of the fourth layer 24. The diode includes the cathode region 29 of the first conductivity type doped with higher concentration than the fourth layer 24 and disposed inside the fourth layer 24, and the cathode electrode 28 which is in ohmic contact with the surface of the cathode region 29. In addition, the semiconductor device includes the fifth layer 27 of the second conductivity type formed along the second surface between the field effect transistor and the diode, and the electrode 26 which is in ohmic contact with the fifth layer 27 and which is grounded.

The dopant concentration of the deep p-type third layer 30 is set equal to a concentration at which breakdown is not caused when a voltage is applied to the drain electrode 21. Therefore, the dopant concentration of the deep p-type third layer 30 does not affect the operation of the hetero junction diode 115. As a result, the hetero junction diode 115 can be used for the temperature sensing, overcurrent sensing or overvoltage sensing.

Figure 3:
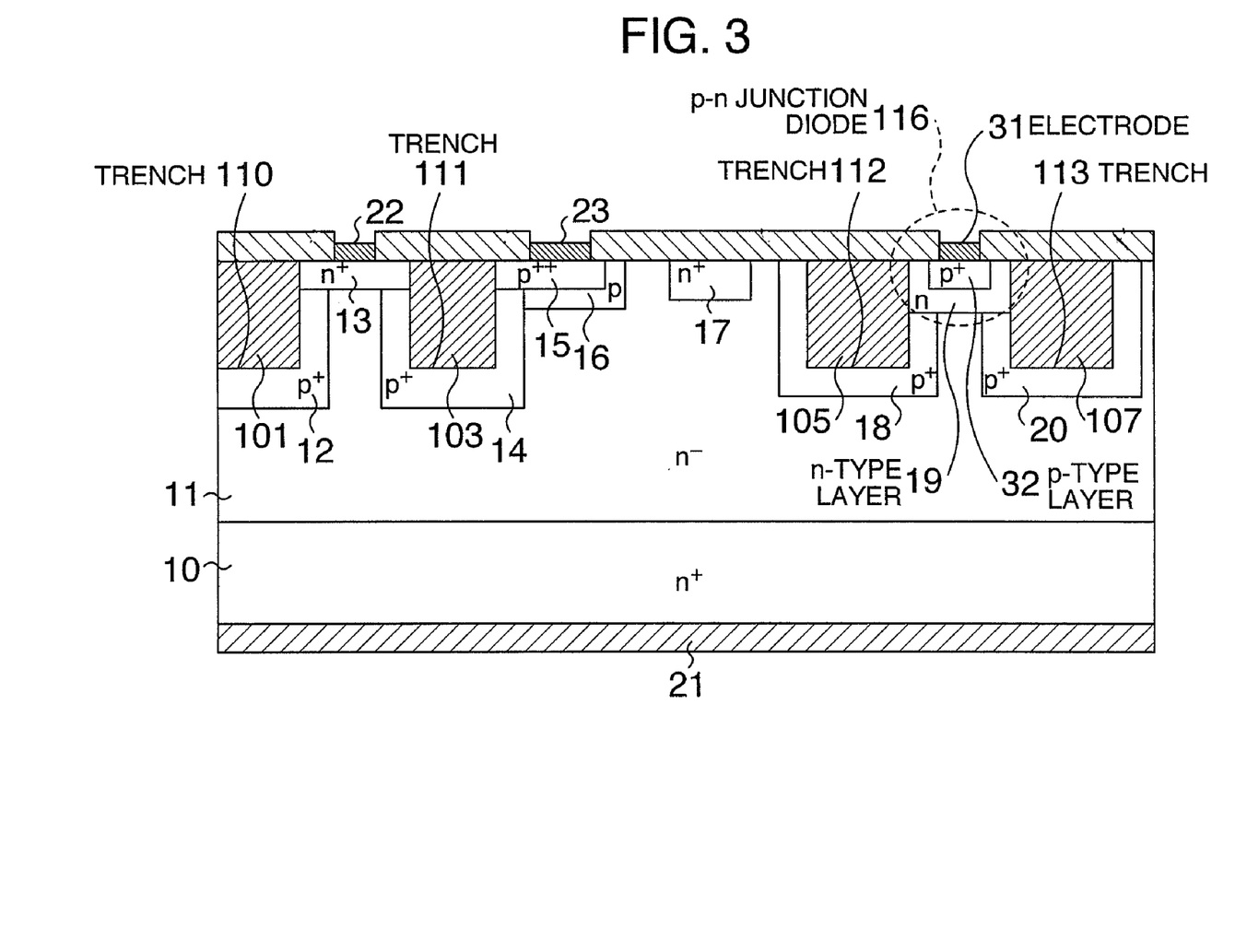
FIG. 3 is a longitudinal section view of a semiconductor device according to a third embodiment of the present invention.

FIG. 3 is a longitudinal section view of a semiconductor device according to a third embodiment of the present invention. Hereafter, the same portions as those in FIG. 1 are denoted by like reference numerals, and duplicated description will be avoided. Only different configurations will be described. The semiconductor device includes an n-type cathode layer 19 in a region sandwiched between the two adjacent trenches 112 and 113. The semiconductor device includes a p-type anode layer 32 inside the n-type cathode layer 19, and an anode electrode 31 in ohmic contact with the p-type anode layer 32. The p-type anode layer 32 and the anode electrode 31 serve as an anode portion and its electrode of a p-n junction diode 116. In the depth direction shown in FIG. 3, the p-type anode layer 32 and the anode electrode 31 do not exist in as far as the deepest portion. In the deepest portion, a cathode electrode (not illustrated) of the p-n junction diode 116 is formed in ohmic contact with the n-type cathode layer 19.

Other portions are the same as those shown in FIG. 1. The distance and concentration between the p-type control layers 18 and 20 are set so as to cause pinch-off when a voltage is not applied to the p-type control layers. A voltage in the range of several hundreds to several thousands volts is applied to the drain electrode 21 of the static induction transistor. Since the p-type control layers 18 and 20 are pinched off, however, the p-n junction 116 functions without being affected by the drain voltage. As a result, the p-n junction 116 can be applied to temperature sensing, overcurrent sensing, or overvoltage sensing.

Figure 4:
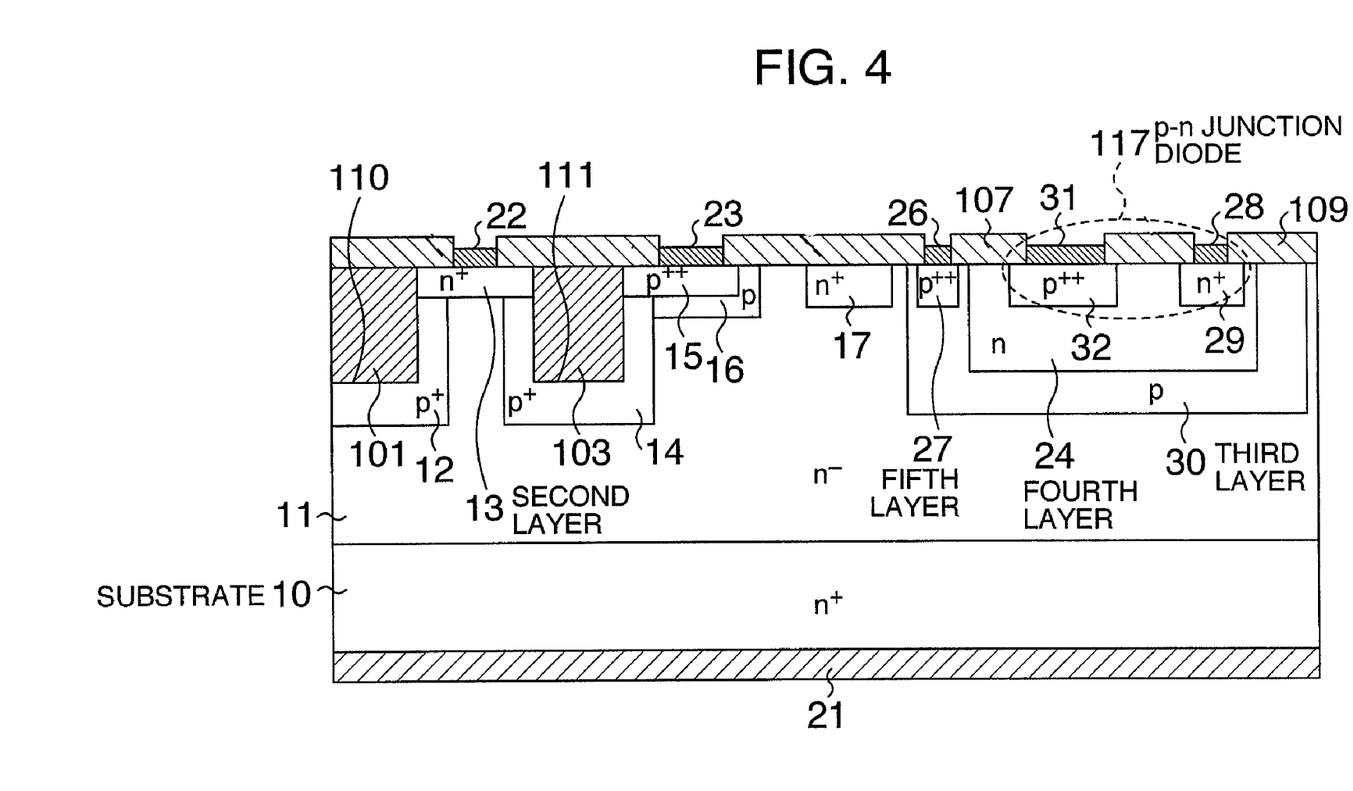
FIG. 4 is a longitudinal section view of a semiconductor device according to a fourth embodiment of the present invention.

FIG. 4 is a longitudinal section view of a semiconductor device according to a fourth embodiment of the present invention. The configuration of the static induction transistor shown on the left side of FIG. 4 is the same as that in FIG. 2. The deep p-type third layer 30 is provided on the same substrate as the static induction transistor. The $p^+$ type fifth layer 27 is provided on the surface of the deep p-type third layer 30. The electrode 26 in ohmic contact with the $p^+$ type fifth layer 27 is provided and grounded. FIG. 4 is the same as FIG. 2 in that the left side and the right side are separated and insulated from each other with the electrode 26 serving as a boundary between them. In the same way as FIG. 2, the n-type fourth layer 24 is provided inside the p-type third layer 30 which is deeper than the trenches 110 and 111, and the $n^+$ type cathode layer 29 is provided along the surface inside the n-type fourth layer 24. In the same way as FIG. 2, the cathode electrode 28 is in ohmic contact with the surface.

A p-type anode layer 32 is provided inside the n-type fourth layer 24 and along the nearly central surface. An anode electrode 31 in ohmic contact with the p-type anode layer 32 is formed. A p-n junction diode 117 is thus formed.

The dopant concentration of the deep p-type third layer 30 is set equal to a concentration at which breakdown is not caused when a voltage is applied to the drain electrode 21. Therefore, the dopant concentration of the deep p-type third layer 30 does not affect the operation of the p-n junction diode 117. As a result, the p-n junction diode 117 can be applied to the temperature sensing, overcurrent sensing or overvoltage sensing.

Figure 5:
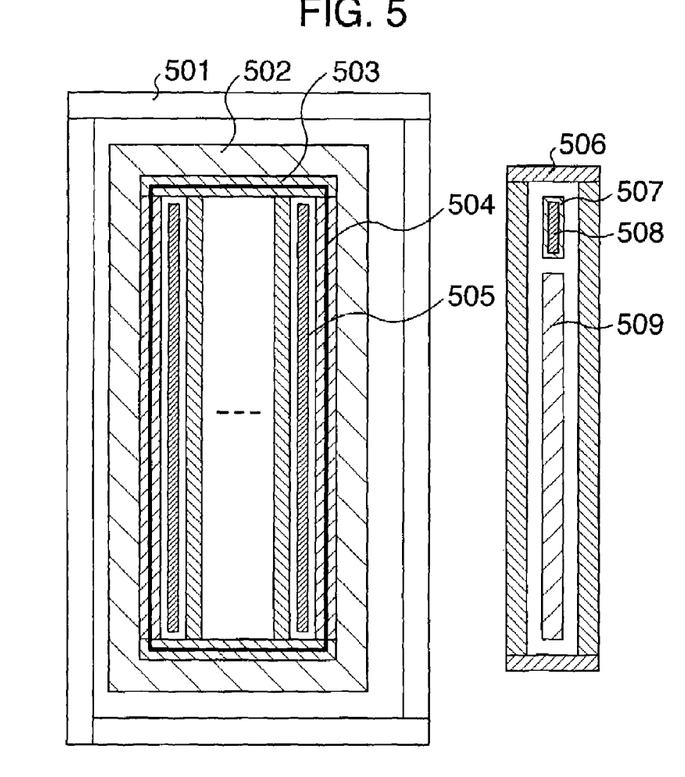
FIG. 5 is a mask pattern for implementing a silicon carbide semiconductor device shown in FIG. 1.

FIG. 5 is a mask pattern diagram for implementing the silicon carbide semiconductor device shown in FIG. 1. The static induction transistor is formed by using patterns 501 to 505, and the hetero junction diode 114 composed of SiC and polycrystalline silicon is formed by using patterns 506 to 509. The pattern 501 is an ion implantation mask pattern for forming the n-type punch-through stopper layer 17 shown in FIG. 1. An inside portion becomes a region subject to the ion implantation. The pattern 502 is an ion implantation mask pattern for forming the p-type layer 16 shown in FIG. 1, and a shaded portion becomes an ion implantation region. Typically, the pattern 502 is made to overlap the mask pattern 503 for forming the trenches, considering mask misalignment. Although it cannot be drawn in FIG. 5, a mask pattern for forming the P⁺ layer 15 shown in FIG. 1 is formed so as to form an ion implantation region on the pattern 502 or approximately several μm inside the pattern 502. The pattern 503 is a pattern for forming the trenches corresponding to the p-type control layers shown in FIG. 1, and shaded portions become the trenches. A thick solid line of the pattern 504 is a mask pattern for forming the n-type source region 13 shown in FIG. 1, and the inside of the solid line becomes an ion implantation region. In the same way as the pattern 502, the pattern 504 is made to overlap the trench forming pattern 503, considering mask misalignment. The pattern 505 is a pattern for forming a contact hole to connect the source region 13 and the source electrode 22 shown in FIG. 1 to each other, and a shaded portion is an opening portion.

The pattern 506 is a pattern for forming the trenches corresponding to the p-type control layers 18 and 20 shown in FIG. 1, and shaded portions are trenches. The pattern 507 is a pattern for forming a high concentration n⁺ layer in the deepest portion in the depth direction in FIG. 1 in order to apply a voltage to the n-type cathode layer 19, and a shaded portion is an ion implantation region. The pattern 508 is a contact hole for coupling the n⁺layer to the cathode electrode (not illustrated), and a shaded portion is an opening portion. The pattern 509 is a pattern for processing the polycrystalline polysilicon 25 shown in FIG. 1 which serves as the anode of the diode, and the polycrystalline polysilicon 25 is left in a shaded portion. Although it cannot be drawn in FIG. 5, it is a matter of course that metal films are deposited in the contact opening holes 505 and 508 and patterns for processing the metal films are needed. If passivation films are formed on the metal films, opening patterns for the passivation films are also needed.

The silicon carbide semiconductor device shown in FIG. 1 can be implemented by using the patterns heretofore described.

Figure 6:
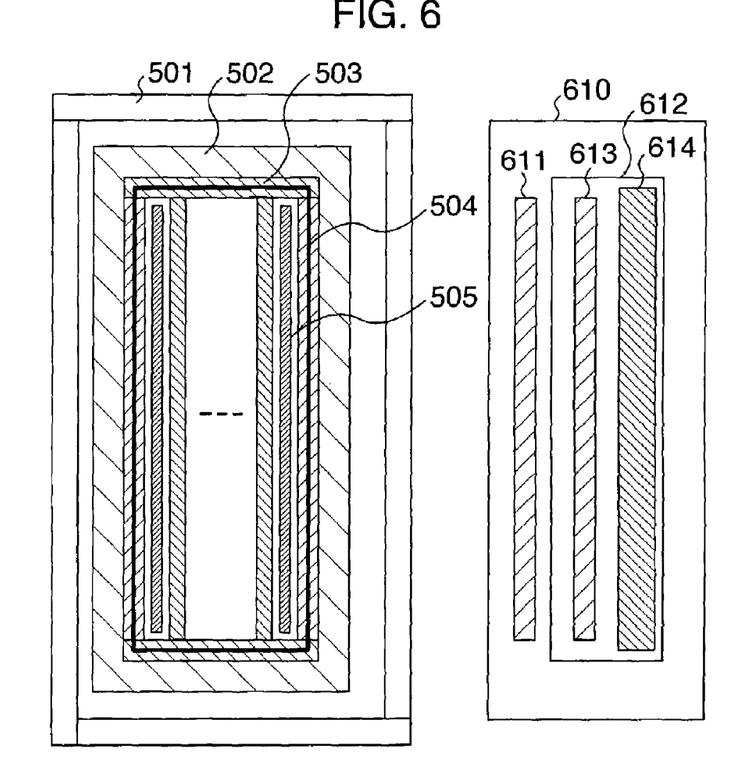
FIG. 6 is a mask pattern for implementing a silicon carbide semiconductor device shown in FIG. 4.

FIG. 6 is a mask pattern diagram for implementing the silicon carbide semiconductor device shown in FIG. 4. Patterns 501 to 505 are patterns for forming the static induction transistor, and they are the same shown in FIG. 5. On the other hand, patterns 610 to 614 are patterns for forming the p-n junction diode 117. The pattern 610 is a pattern for forming the deep p-type third layer 30 shown in FIG. 4, and its inside is an ion implantation region. The pattern 612 is a pattern for forming the n-type fourth layer 24 shown in FIG. 4, and its inside is an ion implantation region. The pattern 613 is a pattern for forming the p⁺ type anode layer 32 shown in FIG. 4, and a shaded portion is an ion implantation region. The pattern 614 is a region for forming the n⁺ type cathode layer 29 shown in FIG. 4, and a shaded portion is an ion implantation region.

Although not illustrated in FIG. 6, patterns for contact opening holes are disposed in the patterns 613 and 614, respectively. As a matter of course, metal films are deposited in the contact opening holes and patterns for processing the metal films are needed. If passivation films are formed on the metal films, opening patterns for the passivation films are also needed.

The silicon carbide semiconductor device shown in FIG. 4 can be implemented by using the patterns heretofore described.

FIGS. 7A to 7H are sectional structure diagrams successively showing manufacture processes A to H which are used to implement the silicon carbide semiconductor device shown in FIG. 1.

Figure 7A:
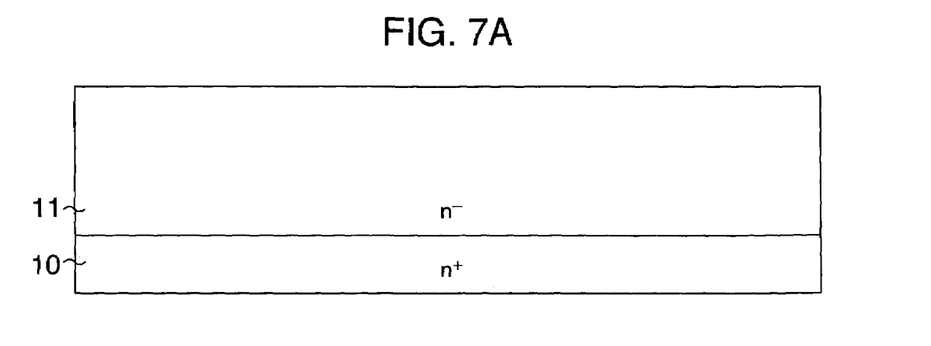
FIG. 7A is a sectional structure diagram showing a manufacture process A for implementing a silicon carbide semiconductor device shown in FIG. 1.
Figure 7B:
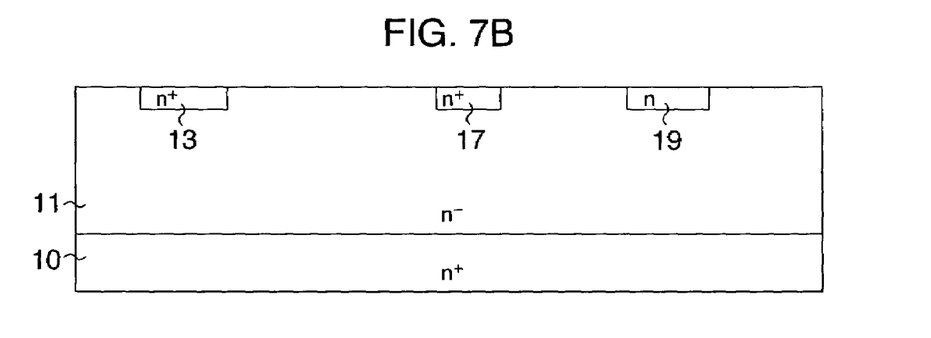
FIG. 7B is a sectional structure diagram showing a manufacture process B for implementing a silicon carbide semiconductor device shown in FIG. 1.

First, with respect to the silicon carbide substance including the n-type semiconductor substrate 10 and the n-type epitaxial layer 11 shown in FIG. 7A, the n⁺ region 13, the n-type layer 17, and the n-type cathode layer (cathode region) 19 are selectively formed in the silicon carbide substance by using, for example, the ion implantation method as shown in FIG. 7B.

Figure 7C:
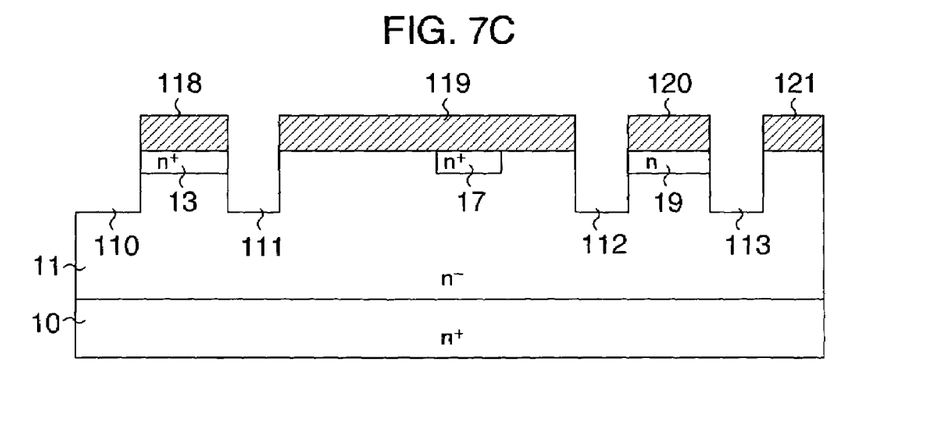
FIG. 7C is a sectional structure diagram showing a manufacture process C for implementing a silicon carbide semiconductor device shown in FIG. 1.

Subsequently, as shown in FIG. 7C, trenches 110 to 113 are formed in the silicon carbide substance. By the way, 118 to 121 shown in FIG. 7C are mask materials used at the time of trench processing, and they are also used as masks for ion implantation in the next process.

Figure 7D:
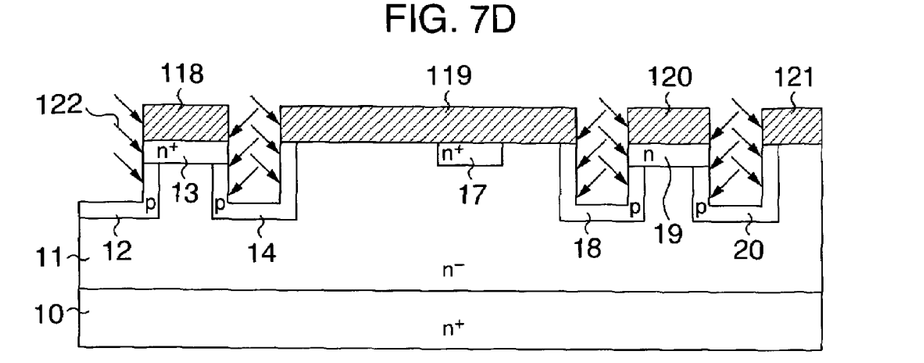
FIG. 7D is a sectional structure diagram showing a manufacture process DA for implementing a silicon carbide semiconductor device shown in FIG. 1.

As shown in FIG. 7D, for example, p-type impurity ions 122 such as aluminum ions are implanted into the side walls of the trenches by using the oblique incident ion implantation method. The p-type control layers 12, 14, 18 and 20 are thus formed. Owing to the mask materials 118 to 121, the n⁺ layer serving as the source region becomes a region the p-type impurity ions do not enter.

Figure 7E:
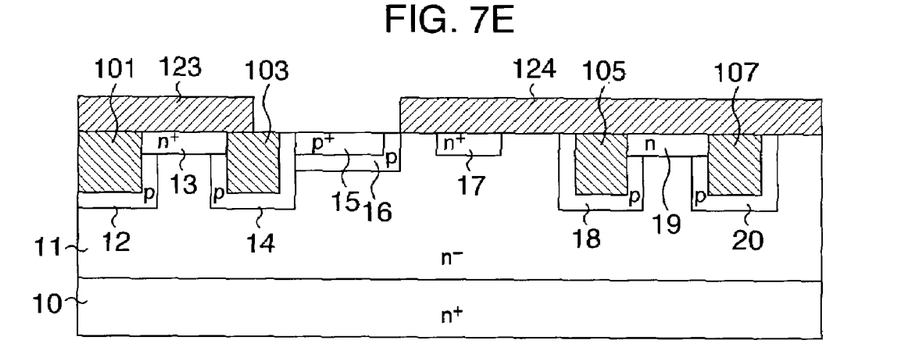
FIG. 7E is a sectional structure diagram showing a manufacture process E for implementing a silicon carbide semiconductor device shown in FIG. 1.

Subsequently, as shown in FIG. 7E, the insulation films 101, 103, 105 and 107 are deposited by using, for example, the CVD method. The trenches are filled with the insulation films 101, 103, 105 and 107 by using the CMP method or the etch-back method. With mask materials 123 and 124, the p-type layer 16 is formed by using the ion implantation method. Subsequently, with new mask materials, the p⁺ layer 15 is formed by using the ion implantation method.

Figure 7F:
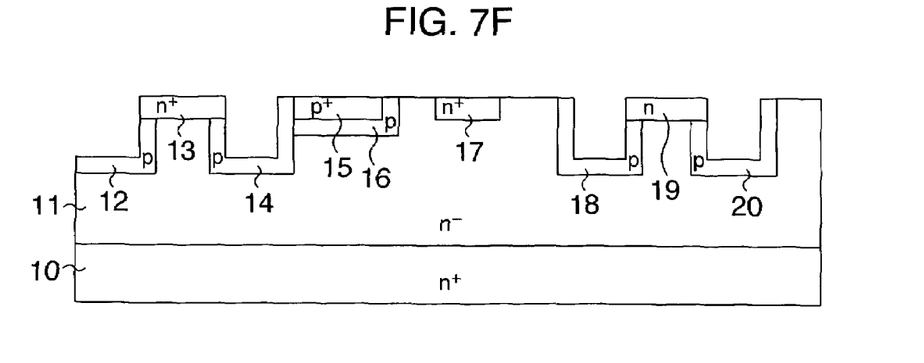
FIG. 7F is a sectional structure diagram showing a manufacture process F for implementing a silicon carbide semiconductor device shown in FIG. 1.

By removing all films as shown in FIG. 7F and conducting annealing at a temperature in the range of approximately 1,500 to 2,000° C. for a time in the range of several seconds to several tens minutes, defects caused at the time of ion implantation are reduced and dopants for ion implantation are activated.

Figure 7G:
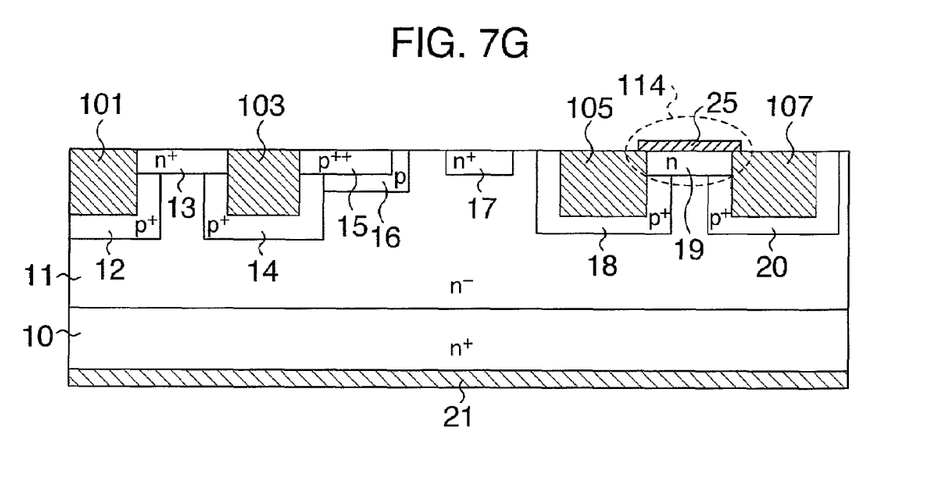
FIG. 7G is a sectional structure diagram showing a manufacture process G for implementing a silicon carbide semiconductor device shown in FIG. 1.
Figure 7H:
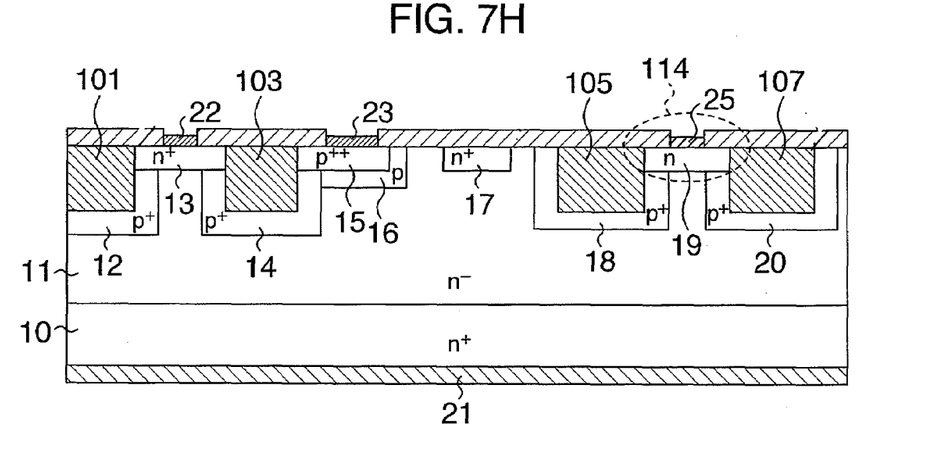
FIG. 7H is a sectional structure diagram showing a manufacture process H for implementing a silicon carbide semiconductor device shown in FIG. 1.

Subsequently, as shown in FIG. 7G, the anode of the illustrated hetero junction diode 114 is generated by filling the trenches with insulation films again, then depositing polycrystalline silicon and conducting patterning. Here, an interlayer insulation film is deposited, and a source contact and a gate contact of the static induction transistor are formed. Metal films are deposited. By depositing a metal film on the surface of the silicon carbide substance and conducting annealing at a high temperature such as approximately 1,000° C., silicidation layers are formed on the source portion, the gate portion, and the drain electrode 21 on the surface opposite to that of the source portion and the gate portion. Thereafter, by providing a contact hole for connecting the crystalline silicon film 25 and the electrode to each other, depositing a metal film, and conducting patterning, the static induction transistor and the hetero junction diode 114 can be obtained on the same silicon carbide substrate as shown in FIG. 7H.

FIGS. 8A to 8F are sectional structure diagrams successively showing manufacture processes A to F which are used to implement the silicon carbide semiconductor device shown in FIG. 4.

Figure 8A:
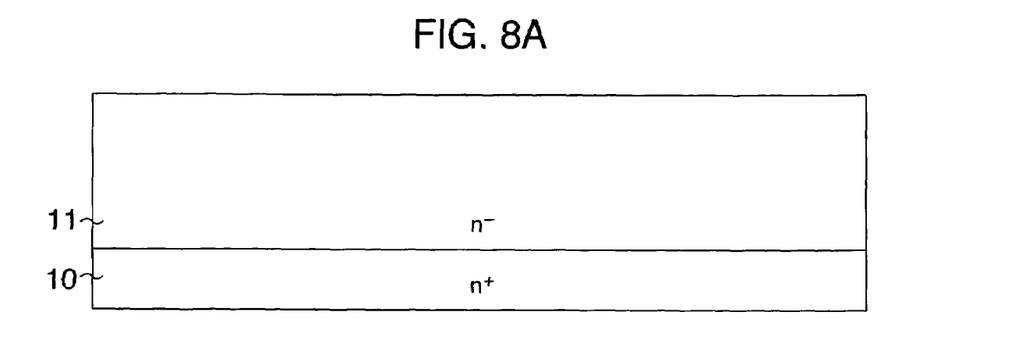
FIG. 8A is a sectional structure diagram showing a manufacture process A for implementing a silicon carbide semiconductor device shown in FIG. 4.
Figure 8B:
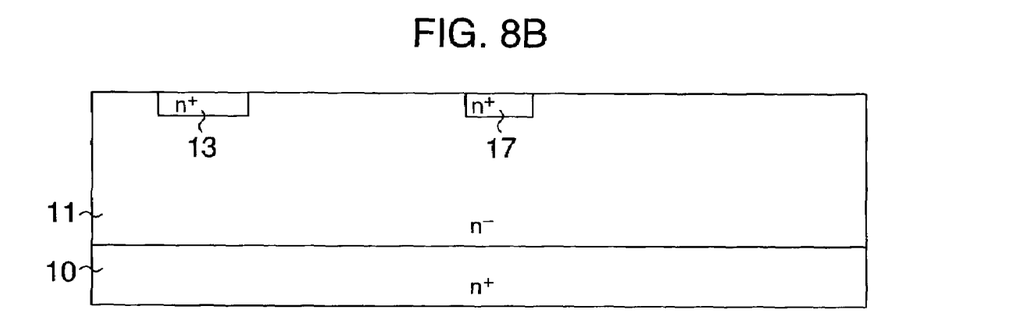
FIG. 8B is a sectional structure diagram showing a manufacture process B for implementing a silicon carbide semiconductor device shown in FIG. 4.

First, with respect to the silicon carbide substance including the n⁺ type first layer 10 and the n-type epitaxial layer 11 shown in FIG. 8A, the n⁺ layers 13 and 17 are selectively formed in the silicon carbide substance by using, for example, the ion implantation method as shown in FIG. 8B.

Figure 8C:
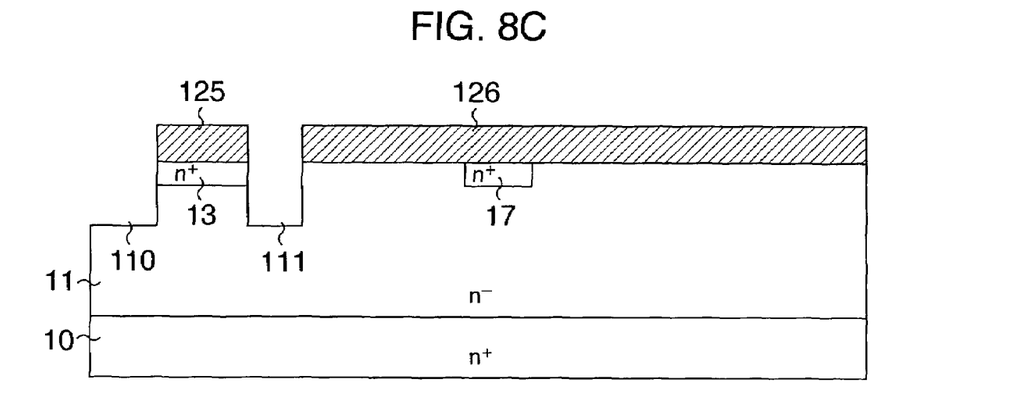
FIG. 8C is a sectional structure diagram showing a manufacture process C for implementing a silicon carbide semiconductor device shown in FIG. 4.

Subsequently, as shown in FIG. 8C, trenches 110 and 111 are formed in the silicon carbide substance. By the way, 125 and 126 shown in FIG. 8C are mask materials used at the time of trench processing, and they are also used as masks for ion implantation in the next process.

Figure 8D:
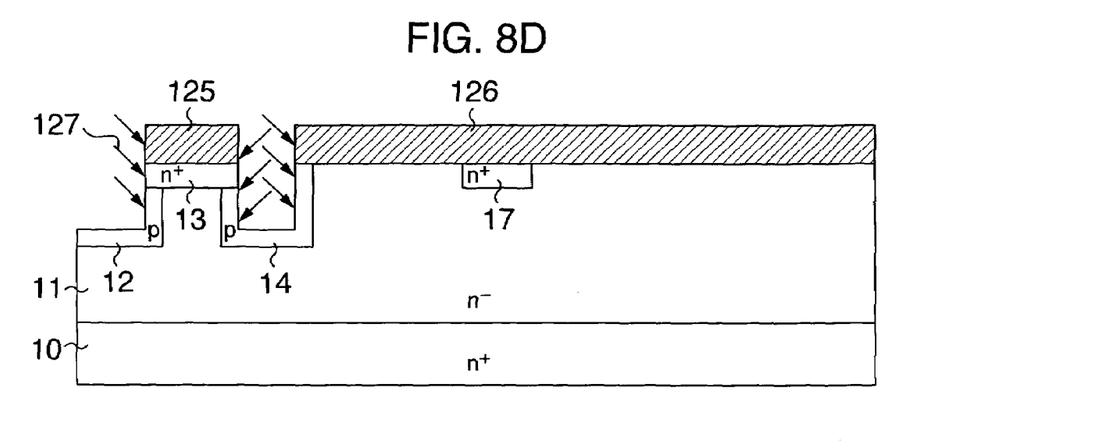
FIG. 8D is a sectional structure diagram showing a manufacture process DA for implementing a silicon carbide semiconductor device shown in FIG. 4.

As shown in FIG. 8D, for example, p-type impurity ions 127 such as aluminum ions are implanted into the side walls of the trenches by using the oblique incident ion implantation method. The p-type control layers 12 and 14 are thus formed. Owing to the mask materials 125 and 126, the n⁺ layer serving as the source region becomes a region the p-type impurity ions do not enter.

Figure 8E:
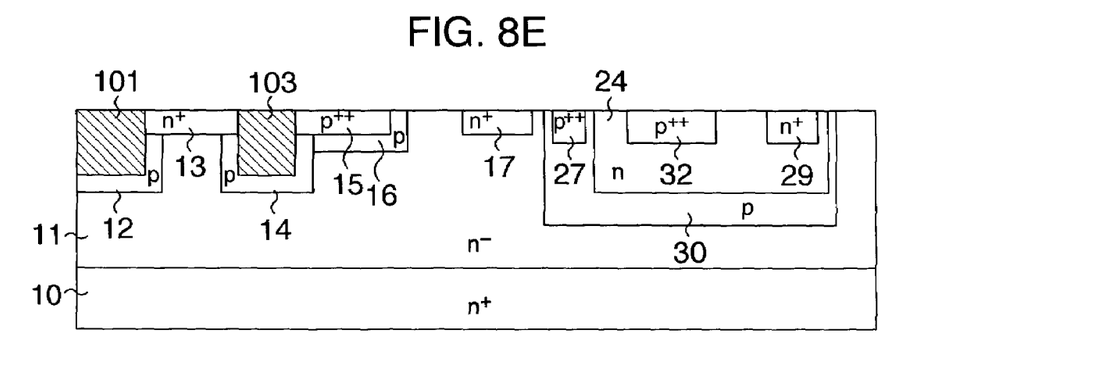
FIG. 8E is a sectional structure diagram showing a manufacture process E for implementing a silicon carbide semiconductor device shown in FIG. 4.

Subsequently, as shown in FIG. 8E, the insulation films 101 and 103 are deposited by using, for example, the CVD method. The trenches are filled with the insulation films 101 and 103 by using the CMP method or the etch-back method. With respective suitable mask materials, the p-type control layer 16, the deep p-type third layer 30, the n-type fourth layer 24, the p⁺ draw-out layer 15, the p⁺ fifth layer 27, the p-type anode layer 32, and the high concentration n⁺ cathode layer 29 are formed by using the ion implantation method.

Figure 8F:
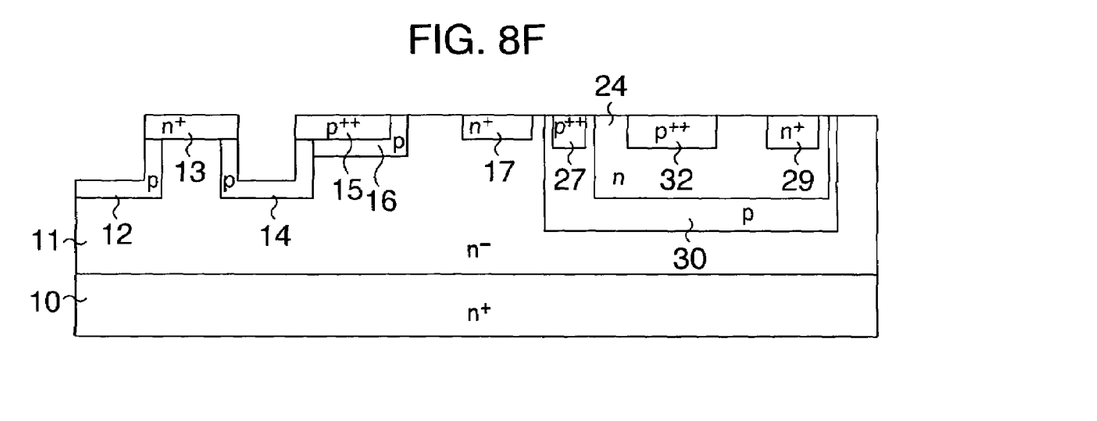
FIG. 8F is a sectional structure diagram showing a manufacture process F for implementing a silicon carbide semiconductor device shown in FIG. 4.

By removing all films as shown in FIG. 8F and conducting annealing at a temperature in the range of approximately 1,500 to 2,000° C. for a time in the range of several seconds to several tens minutes, defects caused at the time of ion implantation are reduced and dopants for ion implantation are activated.

Subsequently, the trenches are filled with insulation films again, and an interlayer insulation film is deposited. A source contact and a gate contact of the static induction transistor are formed, and metal films are deposited. By depositing a metal film on the surface of the silicon carbide substance and conducting annealing at a high temperature such as approximately 1,000° C., silicidation layers are formed on the source portion, the gate portion, and the drain electrode 21 on the surface opposite to that of the source portion and the gate portion. In addition, contact holes are formed in the anode portion and the cathode portion of the p-n junction diode as well simultaneously. The anode electrode and the cathode electrode are formed by conducting electrode patterning. As a result, the static induction transistor and the p-n junction diode 117 shown in FIG. 4 can be obtained on the same silicon carbide substance.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor device comprising:
   (a) a vertical field effect transistor, said vertical field effect transistor comprising:
   a drain electrode formed on a first surface of a first conductivity type of a semiconductor;
   a pair of first trenches formed from a second surface of the semiconductor;
   control regions of a second conductivity type formed respectively along said first trenches;
   a source region of the first conductivity type formed along the second surface of the semiconductor between said first trenches;
   a source electrode joined to said source region; and
   a gate electrode adjacent to said control regions,
   said semiconductor device further comprising;
   (b) a pair of second trenches formed from the second surface of the semiconductor, independently of said field effect transistor;
   (c) control regions of the second conductivity type formed along said second trenches; and
   (d) a diode having a junction formed on the second surface between said second trenches.

2. A semiconductor device according to claim 1, wherein the junction of said diode is a hetero junction between silicon carbide and polycrystalline silicon, a p-n junction or a Schottky junction.

3. A semiconductor device according to claim 1, further comprising a punch-through stopper layer of the first conductivity type formed along the second surface of the semiconductor between said field effect transistor and said diode.

4. A semiconductor device comprising:
   (a) a vertical field effect transistor, said vertical field effect transistor comprising:
   a drain electrode formed on a first surface of a first conductivity type of a semiconductor;
   a pair of first trenches formed from a second surface of the semiconductor;
   control regions of a second conductivity type formed respectively along said first trenches;
   a source region of the first conductivity type formed along the second surface of the semiconductor between said first trenches;
   a source electrode joined to said source region; and
   a gate electrode adjacent to said control regions,
   said semiconductor device further comprising;
   (b) a pair of second trenches formed from the second surface of the semiconductor, independently of said field effect transistor;
   (c) control regions of the second conductivity type formed along said second trenches;
   (d) a cathode layer of the first conductivity type formed along the second surface between said second trenches; and
   (e) a hetero junction diode including polycrystalline silicon of the second conductivity type in contact with said cathode layer.

5. A semiconductor device according to claim 4, further comprising a punch-through stopper layer of the first conductivity type formed along the second surface of the semiconductor between said field effect transistor and said diode.

6. A silicon carbide semiconductor device comprising:
   (a) a vertical field effect transistor, said vertical field effect transistor comprising:
   a substrate of a first conductivity type having a low impurity concentration and a band gap of at least 2.0 eV;
   a first layer formed along a first surface of said substrate, said first layer being lower in resistance than said substrate;
   a drain electrode formed on a surface of said substrate;
   first trenches formed from a surface of said first layer;
   a second region of the first conductivity type formed in said first layer so as to come in contact with said first trenches;
   a source electrode joined to said second region;
   control regions of a second conductivity type formed respectively along said first trenches; and
   a gate electrode adjacent to said control regions,
   said semiconductor device further comprising;
   (b) a pair of second trenches formed in said first layer, independently of said field effect transistor;
   (c) control regions of the second conductivity type formed along said second trenches;
   (d) a cathode region of the first conductivity type formed in said first layer between said second trenches; and (e) a hetero junction diode including polycrystalline silicon of the second conductivity type in contact with said cathode region.

7. A silicon carbide semiconductor device according to claim 6, further comprising a punch-through stopper layer of the first conductivity type formed in said first layer between said field effect transistor and said diode.

* * * * *